United States Patent
Chang

(10) Patent No.: US 7,196,411 B2
(45) Date of Patent: Mar. 27, 2007

(54) HEAT DISSIPATION FOR CHIP-ON-CHIP IC PACKAGES

(75) Inventor: Shih-Cherng Chang, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 10/944,400

(22) Filed: Sep. 17, 2004

(65) Prior Publication Data

US 2006/0060963 A1    Mar. 23, 2006

(51) Int. Cl.
*H01L 23/10* (2006.01)
*H01L 23/34* (2006.01)

(52) U.S. Cl. .............. 257/706; 257/712; 257/678; 257/685; 257/686; 257/713; 257/723

(58) Field of Classification Search ........... 257/276, 257/625, 675, 706–707, 712–722, 796; 438/122; 174/15.1, 15.2, 16.1, 16.3; 361/688–723; 165/104.11–104.34, 185
See application file for complete search history.

(56) References Cited

U.S. PATENT DOCUMENTS

| 5,099,309 | A | * | 3/1992 | Kryzaniwsky | 361/718 |
| 5,821,614 | A | * | 10/1998 | Hashimoto et al. | 257/679 |
| 5,977,640 | A | | 11/1999 | Bertin et al. | |
| 6,472,762 | B1 | * | 10/2002 | Kutlu | 257/778 |
| 6,674,159 | B1 | | 1/2004 | Peterson et al. | |
| 6,716,676 | B2 | * | 4/2004 | Chen et al. | 438/122 |
| 6,720,662 | B1 | | 4/2004 | Den | |
| 2001/0025701 | A1 | * | 10/2001 | Ikeda et al. | 165/80.3 |
| 2002/0149920 | A1 | * | 10/2002 | Babe | 361/760 |
| 2002/0158330 | A1 | * | 10/2002 | Moon et al. | 257/707 |
| 2003/0000689 | A1 | * | 1/2003 | Kuo et al. | 165/185 |
| 2004/0119153 | A1 | * | 6/2004 | Karnezos | 257/686 |
| 2004/0156173 | A1 | * | 8/2004 | Jeong | 361/704 |
| 2005/0046017 | A1 | * | 3/2005 | Dangelo | 257/720 |

OTHER PUBLICATIONS

Kumakura et al. Signal Transmission on leads of TAB-BGA package. 1994. p. 27.*
Kumakura et al., Signal Transmission of Leads of TAB-BGA package; The Second VLSI Packaging Workshop of Japan.

* cited by examiner

*Primary Examiner*—Andy Huynh
*Assistant Examiner*—Hoang-Quan Ho
(74) *Attorney, Agent, or Firm*—Baker & McKenzie LLP

(57) ABSTRACT

Disclosed herein are IC package devices and related methods of manufacturing. In one embodiment, an package device includes first and second package substrates, and a first IC chip having at least one coupling structure formed on its active region for electrically coupling the first chip to the first substrate. The IC package also includes a second IC chip having at least one coupling structure formed on its active region for electrically coupling the second chip to the second substrate. The IC package also includes a heat spreader configured to disperse heat from the first and second chips, where the heat spreader has a first surface coupled to a backside of the first chip, and a second surface that coupled to a backside of the second chip. Thus, the backsides of the two chips are oriented towards each other. The internal heat spreader also provide support across the IC package to prevent warpage, and thus maintain coplanarity of the IC package.

11 Claims, 4 Drawing Sheets

HEAT DISSIPATION FOR CHIP-ON-CHIP IC PACKAGES

TECHNICAL FIELD

Disclosed embodiments herein relate generally to mounting integrated circuit (IC) chips in semiconductor integrated circuit (IC) chip-on-chip packages, and more particularly to orienting the multiple IC chips so that they share the same, or a fewer number of, heat spreaders. Moreover, the internal lids or heat-spreaders are good supporters to prevent warpage and maintain coplanarity of the overall IC package.

BACKGROUND

The packaging of IC chips is one of the most important steps in the manufacturing process, contributing significantly to the overall cost, performance and reliability of the packaged IC chips. As semiconductor devices reach higher levels of integration, packaging technologies, such as chip stacking in chip-on-chip devices, have become critical. Packaging of the IC chip accounts for a considerable portion of the cost of producing the device and failure of the package leads to costly yield reduction.

As semiconductor device sizes have decreased, the density of devices on a chip has increased. Along with such increases in processing power, however, has also come an increase in the amount of heat generated by the multiple chips in such chip-on-chip (or "multi-chip") package devices. As is to be expected, excessive amounts of heat present in the package device can and typically does decrease device performance. Moreover, if the amount of heat present becomes too excessive device, damage may result.

Conventional approaches to combating the presence of heat during device operation typically include providing a heat spreading device (e.g., a "heat spreader") in thermal contact with the IC chips in the IC package device. Usual layouts of such conventional devices have the top surfaces of the IC chips oriented away from each other, with each of these top surfaces in thermal contact with a corresponding heat spreader such that the substrates acting as the heat spreaders also provide the outer surfaces (or "lids") of the IC package device. Unfortunately, having to provide a separate heat spreader for each IC chip can become relatively expensive, especially in IC packages having a large number of stacked IC chips. In addition, each additional heat spreader contributes to the overall size of the IC package device, which is detrimental to the continuing trend of decreased component and device sizes. Accordingly, what is needed is a technique for packaging chip-on-chip devices having efficient heat spreaders, but that does not suffer from the deficiencies found in the prior art.

BRIEF SUMMARY

Disclosed herein are various embodiments of IC package devices and related methods of manufacturing such package devices. In one embodiment, an IC package device includes first and second package substrates, and a first IC chip having at least one coupling structure formed on an active region of the first IC chip for electrically coupling the first IC chip to the first package substrate. In such an embodiment, the IC package device also includes a second IC chip having at least one coupling structure formed on an active region of the second IC chip for electrically coupling the second IC chip to the second package substrate. In addition, the IC package device includes a heat spreader configured to disperse heat from the first and second IC chips, where the heat spreader has a first surface coupled to a backside (which is a non-active region) of the first IC chip that is on an opposite side of the first IC chip than its active region. The heat spreader also has a second surface, opposite its first surface, that is coupled to a backside of the second IC chip that is on an opposite side of the second IC chip than its active region. As such, the backside of the first IC chip is oriented towards the backside of the second IC chip.

In one embodiment of a method of manufacturing an IC package device, the method includes coupling a first IC chip to a first package substrate using at least one coupling structure formed on an active region of the first IC chip. The method also includes coupling a first surface of a heat spreader to a backside of the first IC chip that is on an opposite side of the first IC chip than its active region. In such an embodiment, the method further includes coupling a second surface of the heat spreader that is opposite its first surface to a backside of a second IC chip, where such a heat spreader is configured to disperse heat from the first and second IC chips. In addition, the method includes coupling a second package substrate to the second IC chip using at least one coupling structure formed on an active region of the second IC chip, where the active region of the second IC chip is located on an opposite side of the second IC chip than its backside.

When manufactured using such a method, the backside of the first IC chip is oriented towards the backside of the second IC chip such that they share the same heat spreader for dissipating heat generated during operation of the IC package device. By sharing a single heat spreader, as opposed to manufacturing separate heat spreaders for each IC chip in the package device, a more compact IC package device may be constructed. As a result, overall manufacturing techniques used to construct IC package devices maybe simplified, effectively reducing manufacturing costs and possibly even manufacturing time.

BRIEF DESCRIPTION OF THE DRAWINGS

For a more complete understanding of the principles disclosure herein, and the advantages thereof, reference is now made to the following descriptions taken in conjunction with the accompanying drawings, in which.

DETAILED DESCRIPTION OF PREFERRED EMBODIMENTS

Figure 1:
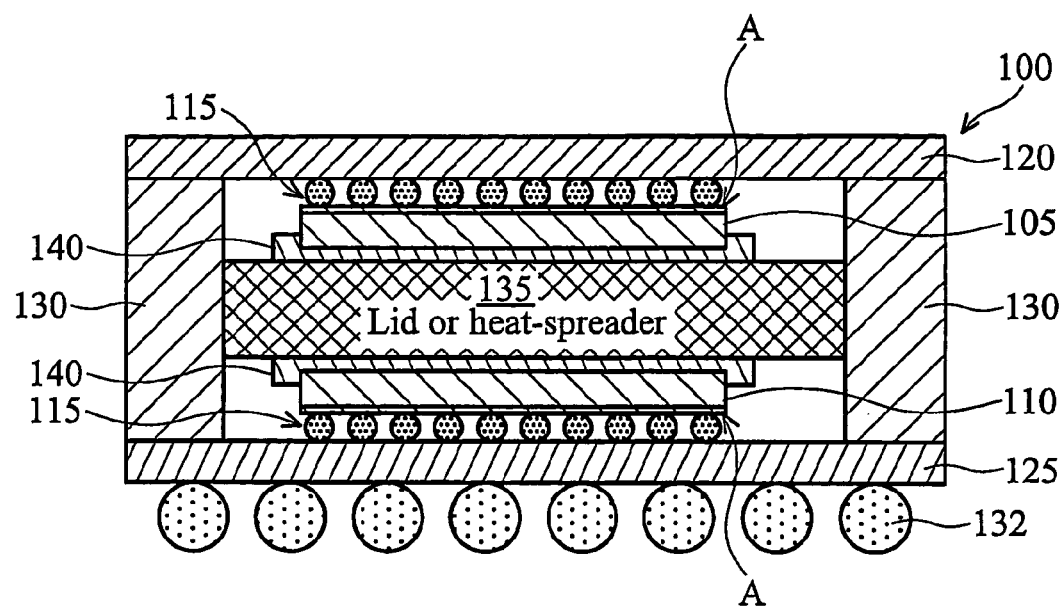
FIG. 1 illustrates one embodiment of an IC package device constructed according to the principles disclosed herein.

Referring initially to FIG. 1, illustrated is one embodiment of an integrated circuit (IC) package device 100 constructed according to the principles disclosed herein. The IC package device 100 includes first and second IC chips 105, 110. Each of the IC chips 105, 110 has a plurality of coupling structures 115. The coupling structures 115 are electrically coupled to corresponding active regions (labeled "A") on each of the IC chips 105, 110. The coupling structures 115, which in this illustrated embodiment are solder bumps, provide an electrical and mechanical coupling to the active region A of each of the IC chips 105, 110. These solder bumps 115 may also be covered by some suitable underfill material in the interstitial space between the chip and the package substrate for stress relief purpose.

The active regions A of the IC chips 105, 110 include structures and interconnections that are coupled to active circuit components within the IC chips 105, 110. As shown in FIG. 1, the first IC chip 105, is coupled to a first IC package lid 120, while the second IC chip 110 is coupled to a second IC package lid 125. As illustrated, the first and second package lids 120, 125 are structurally separated by stiffening members (or simply "stiffeners") 130. Also illustrated coupled to the second package lid 125 are a plurality of other coupling structures, one of which is labeled 132. As with the other coupling structures 115 mentioned above, these coupling structures 132 may also be comprised of solder bumps; however, any beneficial type of coupling structure may also be employed without limitation. Collectively the first and second package lids 120, 125, as well as the stiffeners 130, typically include electrical interconnections that allow the first and second IC chips 105, 110 to be functionally connected to another structure or device via the coupling structures 132.

Also illustrated in the IC package device 100 of FIG. 1 is a heat spreader 135. The heat spreader 135 is coupled between the first and second IC chips 105, 110, and is coupled to their respective backsides typically via a conductive or nonconductive adhesive 140. In an exemplary embodiment, the adhesive 140 may be any type of adhesive commonly employed in such applications, either now existing or later developed. As illustrated, the backsides of the first and second IC chips 105, 110 are located on opposite sides of each IC chip's 105, 110 active region A. By coupling the backsides of both of the IC chips 105, 110 to the heat spreader 135, thermal energy generated during operation of the IC chips 105, 110 may be drawn from the chips 105, 110 by the heat spreader 135 and dissipated appropriately.

By dissipating the heat generated during operation of the IC package device 100, the IC chips 105, 110 may function more efficiently and in many cases benefit from longer operational longevity. In addition to providing the typical heat dispersion function, coupling the heat spreader 135 between the backsides of the first and second IC chips 105, 110 allows for a more compact IC package device 100 to be constructed. For example, rather than having to manufacture a separate heat spreader for each of the IC chips 105, 110, a package device 100 constructed according to the principles disclosed herein requires that only one heat spreader be constructed for use with both of the IC chips 105, 110. As a result, the manufacturing techniques used to construct such IC packages maybe simplified, effectively reducing manufacturing costs and possibly even manufacturing time. Yet another advantage provided by the internal heat spreaders (or "lids") is strong support across the IC package so as to help prevent warpage, and thus help maintain coplanarity of the overall IC package.

Figure 2:
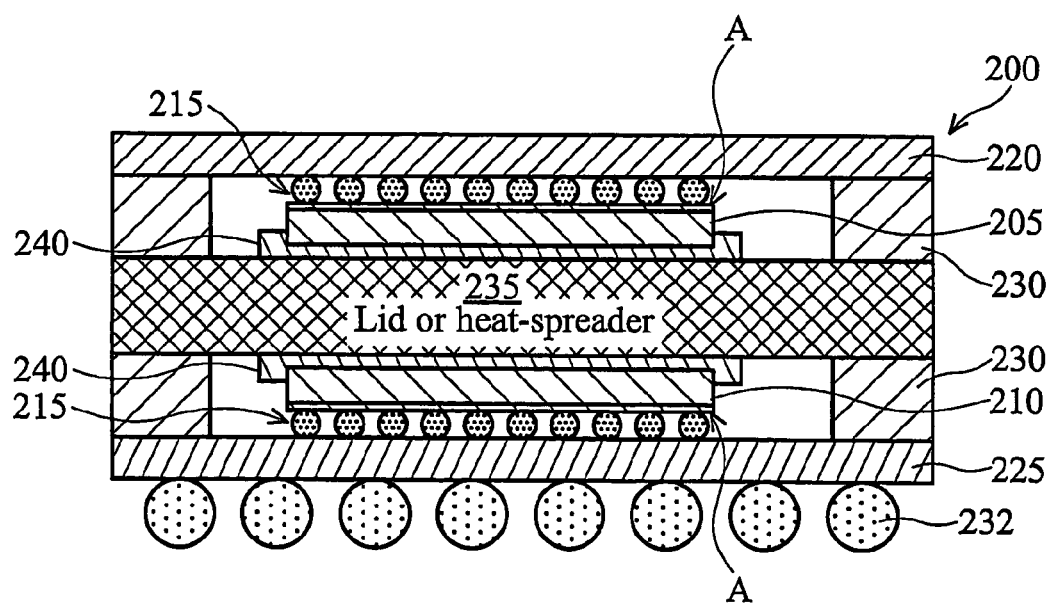
FIG. 2 illustrates another embodiment of an IC package device constructed according to the principles disclosed herein having a heat spreader accessible from outside the IC package device.

Referring now to FIG. 2, illustrated is another embodiment of an IC package device 200 constructed according to the principles disclosed herein. As with the IC package device 100 illustrated in FIG. 1, the IC package device 200 of FIG. 2 also includes first and second IC chips 205, 210 having coupling structures, such as solder bumps 215, respectively coupling active regions A of the first and second IC chips 205, 210 to first and second package lids 220, 225.

A heat spreader 235 is coupled between the IC chips 205, 210, to their respective backsides such that their active regions A face in opposing directions. Also as before, the IC package device 200 of FIG. 2 includes stiffening members 230 coupled between the first and second package lids 220, 225. In this embodiment, however, the stiffening members 230 are coupled on opposing surfaces of the heat spreader 235, rather than adjacent to the ends of the heat spreader 235. As with the first embodiment described above, the heat spreader 235 is coupled between the first and second IC chips 205, 210 using, for example, a conductive or nonconductive adhesive 240 that joins the backsides of the IC chips 205, 210 in thermal connection with the heat spreader 235. The IC package device 200 of FIG. 2 also includes coupling structures 232 along an external surface of the second package lid 225 for coupling the package device 200 to another component or device, such as a printed circuit board (PCB).

By coupling the stiffening members 230 on opposing surfaces of the heat spreader 235, peripheral edges or ends of the heat spreader 235 can be reached from outside the package device 200 (e.g., outside the stiffening members 230). Since the heat spreader 235 can be directly contacted from outside the package device 200, the dispersion of heat generated during operation of the first and second IC chips 205, 210 may be beneficially removed. For example, a heat sink or other heat-dispersing device may be directly coupled to the heat spreader 235 when the IC package device 200 is mounted in its final location.

Figure 3:
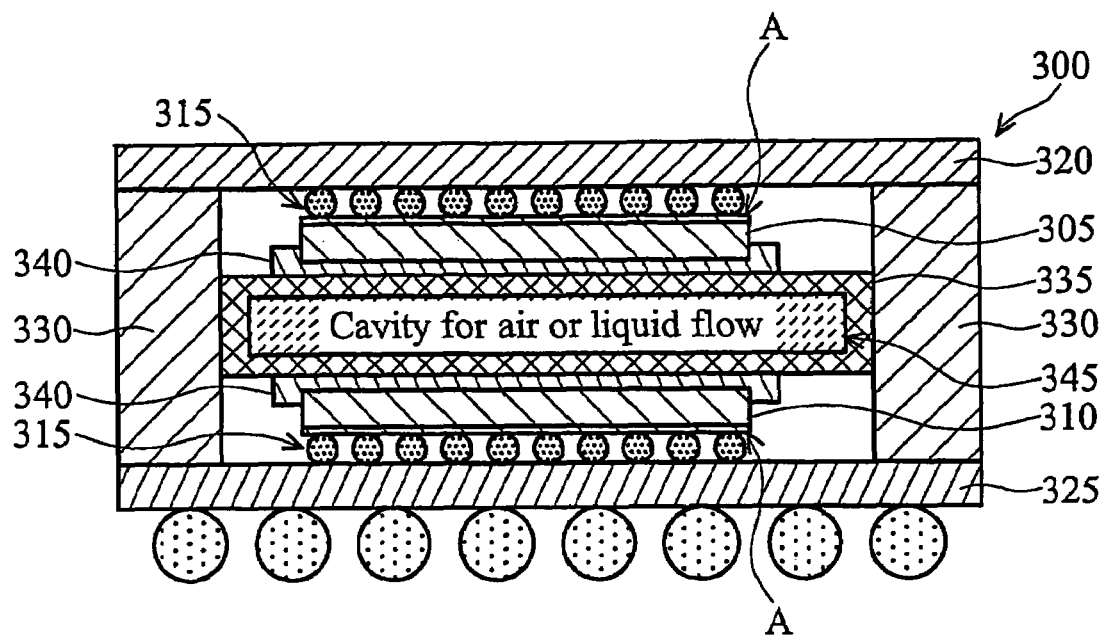
FIG. 3 illustrates an embodiment of an IC package device according to the disclosed principles where the heat spreader includes a cavity to assist in dissipating heat.

Turning now to FIG. 3, illustrated is yet another embodiment of an IC package device 300 constructed according to the disclosed principles. As with the devices of FIGS. 1 and 2, the IC package device 300 illustrated in FIG. 3 includes first and second IC chips 305, 310 that are respectively coupled to first and second package lids 320, 325 via a plurality of coupling structures 315. As with the prior embodiments, the coupling structures 315 maybe constructed using conventional techniques, as well as any other beneficial type of coupling structure for electrically and mechanically coupling the first and second IC chips 305, 310 to the package lids 320, 325.

Similar to the embodiment illustrated in FIG. 1, this embodiment again includes stiffening members 330 coupled between the first and second package lids 320 at the periphery or edges of the package lids 320, 325. Also in these embodiments, the heat spreader 335 is coupled to the backsides of the first and second IC chips 305, 310 such that the active regions A of the IC chips 305, 310 face in opposing directions. In addition, the heat spreader 335 now includes a cavity 345 formed within the heat spreader 335. Although the heat spreader 335 continues to assist in dispersing heat generated by the first and second IC chips 305, 310 in the manner described above, a heat dispersing fluid (i.e., a liquid or a gas) may now also be flowed through the cavity 345 in the heat spreader 335 to assist in the heat dispersing process.

In one embodiment, the fluid that is flowed through the cavity 345 in the heat spreader 335 comprises a liquid capable of transferring heat from the IC chips 305, 310. In a more specific embodiment, the liquid flowing through the cavity 345 is distilled water. In yet another embodiment, the fluid flowing through the cavity 345 may simply be air. Of course, there is no limitation in the type of fluid that maybe flowed through the cavity 345 to assist in the heat dispersing process. In an advantageous embodiment, the width of the cavity 345 extends beyond the widths of the first and second IC chips 305, 310 in order to more efficiently disperse heat during operation of the device 300. Of course, however, no limitation to any particular width for the cavity 345 is intended. In addition, no limitation to only a single cavity 345 formed through the heat spreader 335, or even the shape of the cavity 345, is intended. As such, two or more cavities for flowing a fluid through the heat spreader 335 may be included in the design and manufacture of the IC package device 300.

Figure 4:
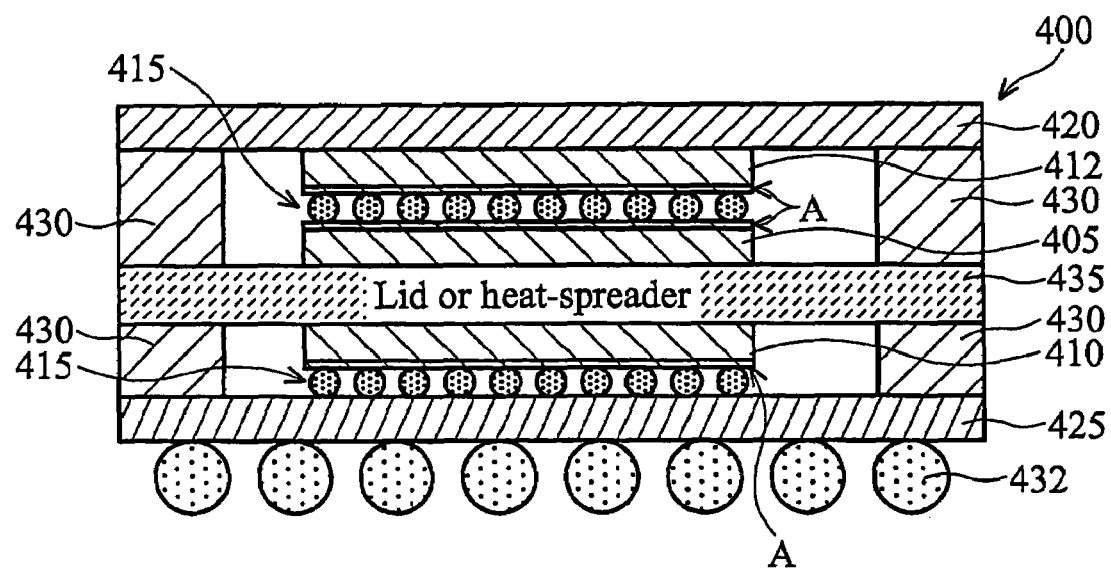
FIG. 4 illustrates an embodiment of an IC package device having three IC chips.

Looking now at FIG. 4, illustrated is another embodiment of an IC package device 400 constructed according to the disclosed principles. In this illustrated embodiment, however, three IC chips 405, 410, 412 are included in the device 400. More specifically, the first and second IC chips 405, 410 are coupled to a heat spreader 435 located between the backsides on the IC chips 405, 410. As with the prior embodiments discussed above, the second IC chip 410 includes a plurality of coupling structures (e.g., solder bumps) 415 coupled to that chip's 410 active region A for coupling the second IC chip 410 to a second package lid 425. The second package lid 425 also includes its only coupling structures, such as solder bumps 432, that may be employed to electrically and mechanically couple the package device 400 to another structure or device.

To mount the third IC chip 412, the coupling structures 415 associated with and coupled to the active region A of the first IC chip 405 are also electrically and mechanically coupled to the active region A of the third IC chip 412. As with all embodiments employing solder bumps as the coupling structures 415, the bond between the active regions A of the first and third IC chips 405, 412 is a metallurgical bond. Once the third IC chip 412 is coupled to the first IC chip 405, a first package lid 420 is coupled over the backside of the third IC chip 412. Since the first package lid 420 is coupled to the backside of the third IC chip 412, the first package lid 420 may itself be a heat dissipating structure similar to the heat spreader 435. As such, the heat spreader 435 is operable to assist in dispersing heat generated by the first and second IC chips 405, 410, while the first package lid 420 is operable to assist in dispersing heat generated by the operation of the third IC chip 412.

Finally, to complete the package device 400 stiffening members 430 may be placed on opposing surfaces and at the periphery of the heat spreader 435, and between the periphery of the first and second package lids 420, 425. As discussed in detail above, the first and second package lids 420, 425, as well as the stiffening members 430, may all include electrical interconnections that electrically connect the first, second, and third IC chips 405, 410, 412 to another structure or device via the coupling structures 432.

Figure 5:
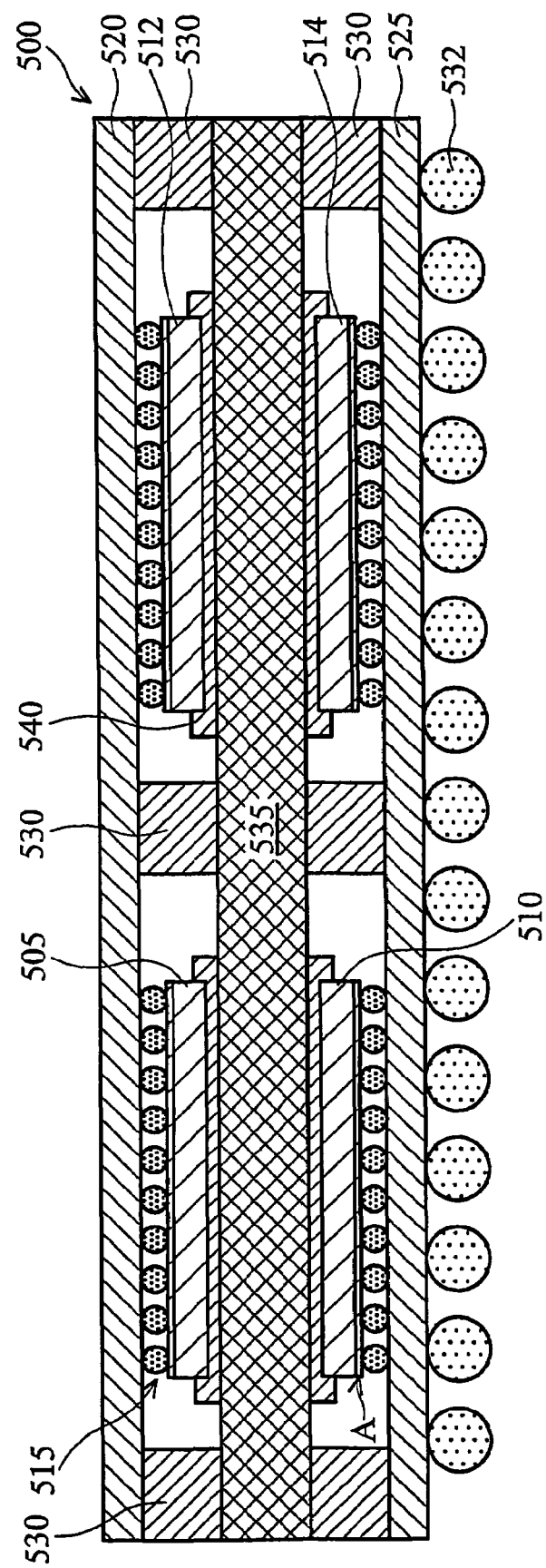
FIG. 5 illustrates an embodiment of an IC package device having pairs of IC chips sharing the same heat spreader.

Turning now to FIG. 5, illustrated is an embodiment of an IC package device 500 having four IC chips 505, 510, 512, 514. In this embodiment, the first and second IC chips 505, 510, and the third and fourth IC chips 512, 514, are coupled together in pairs, each in a manner similar to that discussed with reference to FIG. 2. Specifically, the first IC chip 505 is coupled to a first package lid 520 via coupling structures 515, while the second IC chip 510 is coupled to a second package lid 525 using similar coupling structures. Likewise, the third IC chip 512 is also coupled to the first package lid 520 via coupling structures such as solder bumps, while the fourth IC chip 514 is coupled to the second package lid 525 along side the second IC chip 520.

By coupling the IC chips 505, 510, 512, 514 in such sets, the backsides of the first and third IC chips 505, 512 are coupled to one surface of a heat spreader 535, while the second and fourth IC chips 510, 514 are coupled to an opposing surface of the heat spreader 535. Stiffening members 530 are again coupled between this first and second package lids 520, 525, and on corresponding opposing surfaces of the heat spreader 535 so that the edges of the heat spreader 535 is accessible from outside the device 500. Also as before, the package device 500 may be coupled to another structure or device via coupling structures 532 formed on an external surface of the second package lid 525. The embodiment illustrated in FIG. 5 demonstrates how multiple IC chips may be coupled in pairs adjacent to each other (e.g., on the same side of a single heat spreader 535) and share the single heat spreader 535 for dissipating heat during device 500 operation. As a result, only one heat spreader 535 needs to be manufactured in the embodiment of FIG. 5, and that heat spreader 535 is shared by all four IC chips 505, 510, 512, 514 in the device 500.

Figure 6:
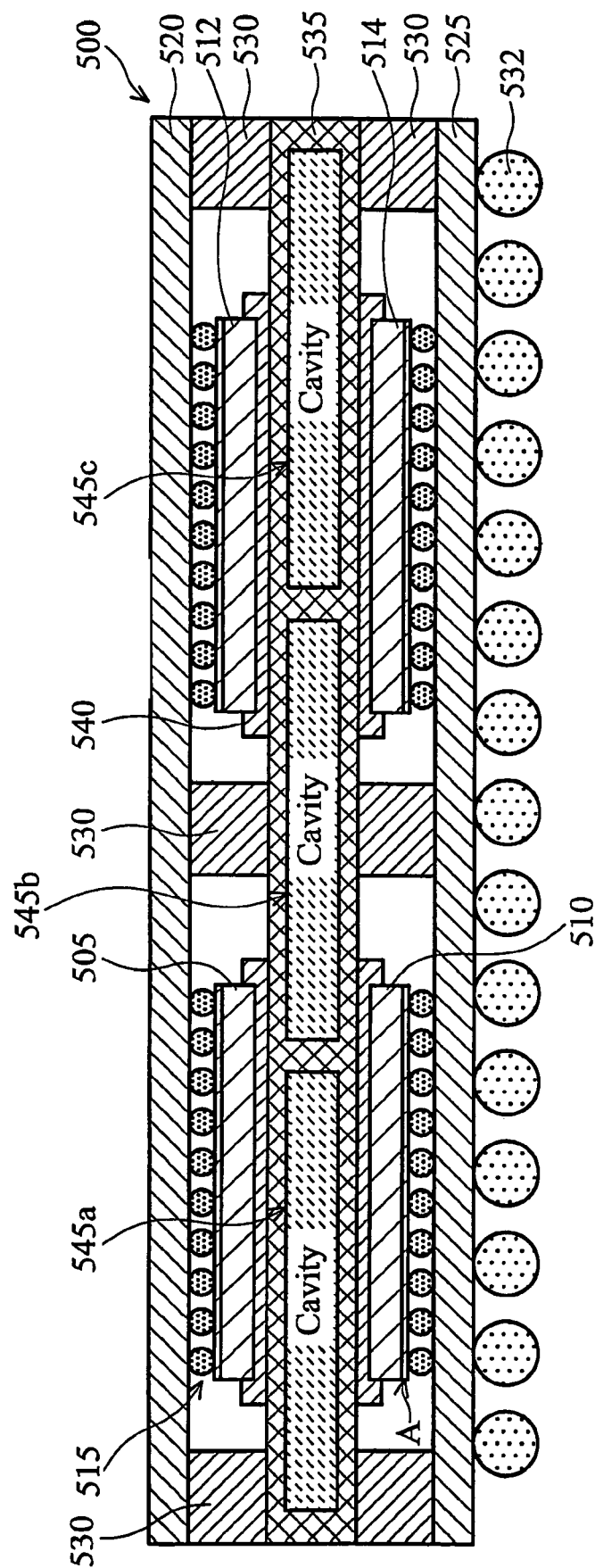
FIG. 6 illustrates another embodiment of an IC package device of FIG. 5 where the heat spreader includes a plurality of cavities to assist in dissipating heat from the pairs of IC chips.

Turning finally to FIG. 6, illustrated is the same IC package device 500 illustrated in FIG. 5, however, the heat spreader 535 now includes three cavities 545a, b, c formed through it. As with the IC package device 300 discussed with reference to FIG. 3, the cavities 545a, b, c may be used to pass a fluid within the heat spreader 535 to assist in the dissipating of heat generated during the operation of the first, second, third, and fourth IC chips 505, 510, 512, 514. Also as before, any type of fluid useful in the transfer of heat may be flowed through the cavities 545a, b, c, such as water or air. Moreover, while only three cavities 545a, b, c are illustrated in FIG. 6, no limitation is intended on the number of cavities that may be formed through the heat spreader 535. In addition, the width of each cavity 545a, b, c need not be equal as shown in FIG. 6, but rather may be independently selected based on heat dispersing needs.

While various embodiments of IC package devices having improved heat dissipating capabilities, and related method of manufacturing the same, have been described above, it should be understood that they have been presented by way of example only, and not limitation. Thus, the breadth and scope of the invention(s) should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. An IC package device, comprising:
    first and second package substrates;
    a first IC chip having solder balls formed on an active region of the first IC chip for electrically coupling the first IC chip to the first package substrate;
    a second IC chip having solder balls formed on an active region of the second IC chip for electrically coupling the second IC chip to the second package substrate;
    a heat spreader configured to disperse heat from the first and second IC chips, the heat spreader having a first surface coupled to a side of the first IC chip opposite the active region, and the heat spreader having a second surface coupled to a side of the second IC chip opposite the active region; and
    a first set of stiffening members coupled between corresponding peripheries of the first package substrate and of the first surface of the heat spreader, and a second set of stiffening members coupled between corresponding peripheries of the second package substrate and of the second surface of the heat spreader, a perimeter edge of the heat spreader extending to outside surfaces of the first and second sets of stiffening members that face away from the IC chips such that the perimeter edge of the heat spreader is accessible from outside the first and second sets of stiffening members.

2. The IC package device according to claim 1, wherein the backside of the first IC chip is oriented towards the backside of the second IC chip.

3. The IC package device according to claim 1, wherein the heat spreader is comprised of a metal, compound metal, alloy, or composite.

4. The IC package device according to claim 3, wherein the heat spreader is comprised of aluminum, copper, AlSiC, Cu/C, or other alloy or composite with a high thermal conductivity.

5. The IC package device according to claim 1, wherein the heat spreader further comprises at least one cavity formed therein for passing a fluid through the heat spreader for dispersing heat.

6. The IC package device according to claim 5, wherein a width of the at least one cavity is greater than widths of either the first or second IC chips.

7. The IC package device according to claim 5, wherein the fluid is a liquid or a gas.

8. The IC package device according to claim 1, wherein the first and second IC chips are coupled to the heat spreader using a conductive or nonconductive adhesive.

9. The IC package device according to claim 1, wherein one or both of the first and second package substrates further comprises at least one coupling structure formed on an external surface thereof for coupling the IC package device to another structure.

10. The IC package device according to claim 1, wherein a center of any one or more of the first IC chip, the second IC chip, the package substrate, and the heat spreader are not aligned with a center of one or more of the others.

11. The IC package device according to claim 1, wherein a surface area of the package substrate is different than a surface area of the heat spreader.

* * * * *